(12) United States Patent
Funatsu et al.

(10) Patent No.: US 6,566,654 B1
(45) Date of Patent: May 20, 2003

(54) INSPECTION OF CIRCUIT PATTERNS FOR DEFECTS AND ANALYSIS OF DEFECTS USING A CHARGED PARTICLE BEAM

(75) Inventors: Ryuichi Funatsu, Hitachinaka (JP); Shigeto Isakozawa, Hitachinaka (JP); Hidemi Koike, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/697,773

(22) Filed: Oct. 27, 2000

(30) Foreign Application Priority Data

Oct. 29, 1999 (JP) ............................ 11-308506

(51) Int. Cl.[7] ................................ G03F 9/00
(52) U.S. Cl. ............ 250/310; 250/306; 250/492.2; 250/492.22; 438/14; 438/474
(58) Field of Search ............... 250/310, 306, 250/492.2, 492.22; 438/14, 474

(56) References Cited

U.S. PATENT DOCUMENTS

| 5,023,453 A | | 6/1991 | Adachi et al. ............... 250/309 |
|---|---|---|---|
| 5,028,780 A | | 7/1991 | Kaito et al. .................. 250/307 |
| 5,132,507 A | * | 7/1992 | Nakano .................. 219/121.31 |
| 6,180,289 B1 | * | 1/2001 | Hirayanagi .................... 430/5 |

FOREIGN PATENT DOCUMENTS

| JP | 4-76437 | 3/1992 | ............ G01N/1/28 |
|---|---|---|---|
| JP | 5-52721 | 3/1993 | |
| JP | 6-103947 | 4/1994 | |
| JP | 10-294345 | 11/1998 | |
| JP | 11-51886 | 2/2002 | |

* cited by examiner

Primary Examiner—Bruce Anderson
Assistant Examiner—Nikita Wells
(74) Attorney, Agent, or Firm—McDermott, Will & Emery

(57) ABSTRACT

The present invention is intended to detect defects in a circuit pattern formed on a semiconductor wafer by a circuit pattern forming process, to facilitates the extraction and observation of the defects, to improve the accuracy of analysis of the causes of the defects, and to determine the causes of the defects and to take measures to eliminate the causes of the defects in a greatly reduced time after the formation of the defects. A method of inspecting a circuit pattern for defects and analyzing defects, comprising locating a defect in a circuit pattern formed on a wafer by using an electron beam, specifying a chip having the defect on the basis of position data on the defect, cutting out the chip from the semiconductor wafer, thinning a portion of the chip to form a thin portion, and observing the thin portion of the chip under a transmission electron microscope to determine the causes of the defect.

13 Claims, 8 Drawing Sheets

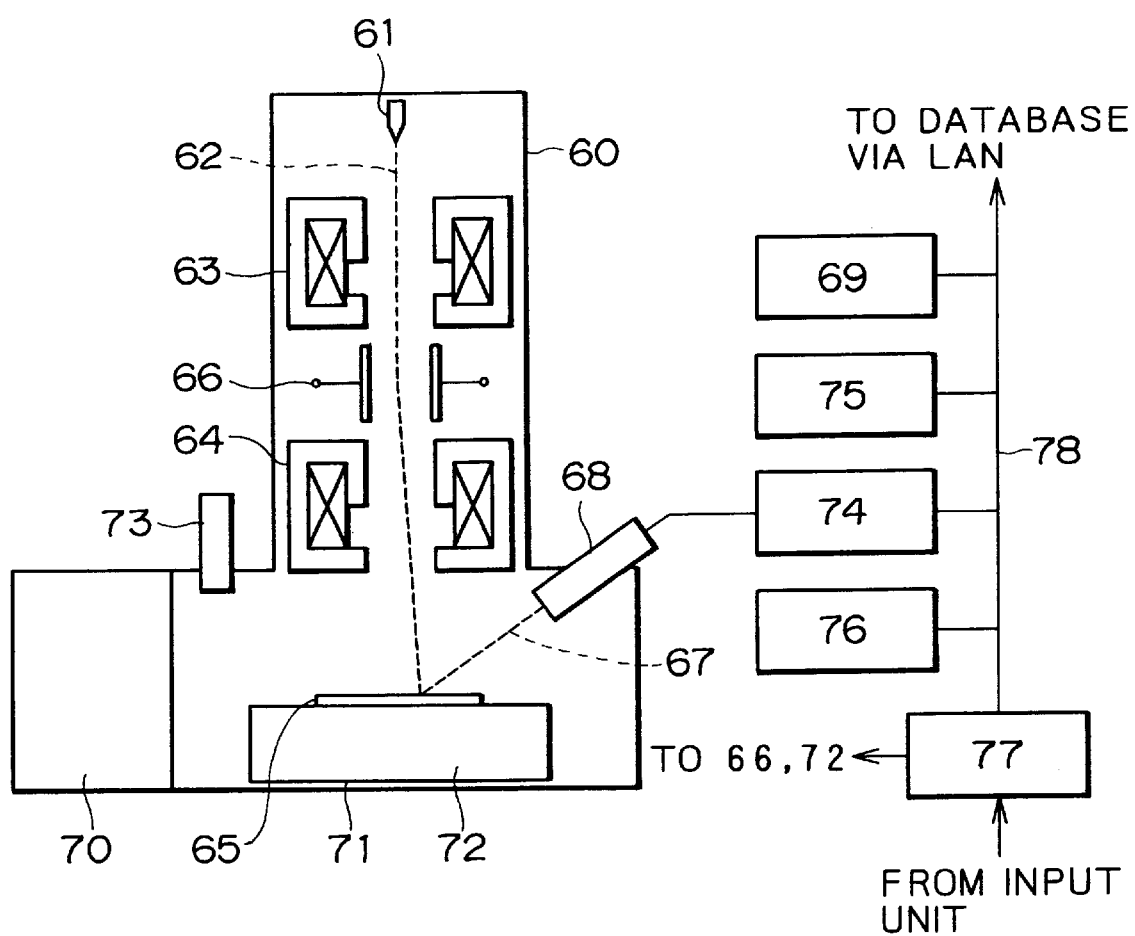

INSPECTION OF CIRCUIT PATTERNS FOR DEFECTS AND ANALYSIS OF DEFECTS USING A CHARGED PARTICLE BEAM

FIELD OF THE INVENTION

The present invention relates to a method of inspecting a circuit pattern of a semiconductor device for defects and analyzing defects to determine the causes of defects by using a charged particle beam, a system for inspecting a circuit pattern of a semiconductor device and analyzing defects, and circuit pattern inspecting system.

BACKGROUND OF THE INVENTION

Circuit pattern miniaturization and increase in the layers of multilevel structures have made a rapid progress and new process techniques have been introduced to cope with the progressively increasing level of integration of semiconductor devices, such as semiconductor storage devices and semiconductor integrated arithmetic elements. Such a rapid progress of circuit pattern miniaturization and increase in the layers of multilevel structures have entailed a serious problem associated with the reduction of the yield of semiconductor devices by defects in the lower layers of semiconductor devices formed on a semiconductor wafer.

FIG. 2 is a fragmentary sectional view of a portion of a semiconductor device 11 near the surface of the semiconductor device 11 in a process of fabricating the semiconductor device 11. A lower wiring layer 22 is electrically connected to an upper wiring layer by a plug 21 formed in a via extending through an insulating film covering the lower wiring layer 22. It is possible that the electrical connection of the lower wiring layer 22 to the upper wiring layer is prevented by the residual insulating film remaining between the plug 21 and the layer 22. When forming gate electrodes 23, a conductive substance of the same electrical conductivity as the gate electrodes 23 is formed around the gate electrodes 23, and it is possible that the gate electrode 23 and the plug 21 are short-circuited or the lower wiring layer 22 is short-circuited by the conductive substance.

A conventional inspecting apparatus using reflected light has difficulty in detecting such internal defects in semiconductor devices. Therefore, a semiconductor device inspecting and defect analyzing procedure represented by a flow chart shown in FIG. 3 is executed. It is difficult to detect defects in circuit patterns of semiconductor devices formed on a semiconductor wafer in a circuit pattern forming step of a semiconductor device fabricating process. After the completion of formation of circuit patterns of semiconductor devices on a semiconductor wafer in step 30, the semiconductor wafer is subjected to a probe test for testing the electrical functions of the semiconductor devices in step 31 before dicing the semiconductor wafer into chips. If the semiconductor devices a re memory chips, all the bits of the memory chips are inspected to classify the bits into good ones and defective ones. A fail bit map indicating the coordinates of the defective bits is made in step 32. A defective chip is cut out of the semiconductor wafer, surface layers of the semiconductor device formed on the chip are removed by etching to expose a layer presumed to have defects on the basis of data provided by the fail bit map in step 33. A presumably defective portion of the exposed layer is observed under a scanning electron microscope in step 34 to look deep into the causes of the defects.

Another procedure slices longitudinally a defective portion of the chip cut out of the semiconductor wafer to prepare a sample for section observation in step 35, and observes the section of the defective portion under a transmission electron microscope or a scanning transmission electron microscope to look deep into the causes of defects in step 36. However, since defects and their positions are detected by the probe test in step 31 after the completion of the circuit, it takes, in some cases, several months to complete investigation for determining the causes of the defects, and the fabrication of products at low yield is continued until the causes of the defects are determined and hence the conventional semiconductor device inspecting methods causes immeasurable economical loss.

SUMMARY OF THE INVENTION

Accordingly, it is an object of the present invention to provide a method of inspecting circuit patterns of semiconductor devices for defects and analyzing defects to find causes of defects, a system for inspecting circuit patterns of semiconductor devices and analyzing defects, and a circuit pattern inspecting system capable of detecting defects in the circuit patterns formed on a semiconductor wafer by a circuit pattern forming step during the circuit pattern forming step, of facilitating the extraction and observation of defective portions from the semiconductor wafer, of accurately analyzing the causes of defects and of reducing the time necessary to achieve the determination of the causes of the defects and to take measures to eliminate the causes of the defects.

With the foregoing object in view, the present invention provides a method of inspecting circuit patterns formed on a semiconductor wafer for defects and analyzing the defects, including the steps of detecting locating defects by using a charge particle beam, such as an electron beam, finding a chip having defects on the basis of positions of the defects located by using the charged particle beam, extracting a chip having the defects from the semiconductor wafer, processing the extracted chip to prepare a thin sample, observing the thin sample under a transmission electron microscope (hereinafter abbreviated to "TEM") or a scanning transmission electron microscope (hereinafter abbreviated to "STEM") to determine the causes of the defects.

Since the circuit patterns are inspected for defects by using a wafer inspecting apparatus that uses an electron beam and is capable of changing electron beam current and deceleration voltage, defects in the internal structures of a semiconductor device that cannot be detected through the observation of the surface of the semiconductor wafer can be detected.

Positions of defects or portions near defects are marked, coordinates of the positions of defects are accurately determined or the distance between a reference point on the circuit pattern and positions of defects are measured to facilitate the confirmation of the positions of the detected defects in the subsequent steps.

Morphologies of defects.can be easily known through the observation of the sample having the defects under a TEM or a STEM and hence the causes of the defects can be quickly determined.

Since defects can be detected during the step of forming the circuit pattern and the causes of the defects can be determined by the system of the present invention, the detection of defects does not need to wait until the final step in which a probe test is executed, defects can be detected and measures to eliminate the defects can be taken in a short period, so that period necessary to develop a new semiconductor device can be greatly reduced. When mass-producing semiconductor devices, defects can be detected before the final step of the semiconductor device fabricating process. Consequently, period in which defective semiconductor devices are produced can be greatly reduced and the reduction of yield can be prevented.

BRIEF DESCRIPTION OF THE DRAWINGS

FIG. 5 is a schematic longitudinal sectional view of an electron beam wafer inspecting apparatus;

DETAILED DESCRIPTION OF THE PREFERRED EMBODIMENTS

A circuit pattern inspecting and defect analyzing system in a preferred embodiment according to the present invention will be described with reference to the accompanying drawings.

Figure 1:
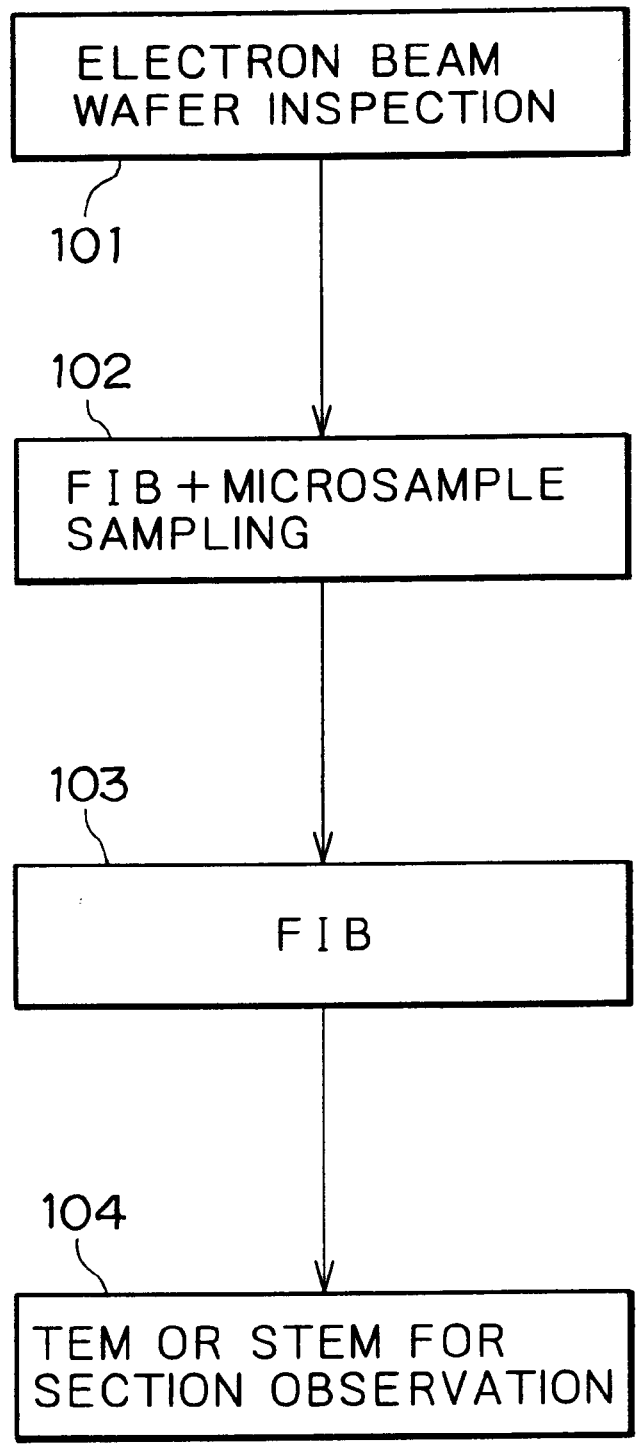
FIG. 1 is a flow chart of a circuit pattern inspecting procedure of a semiconductor device.
Figure 4A:
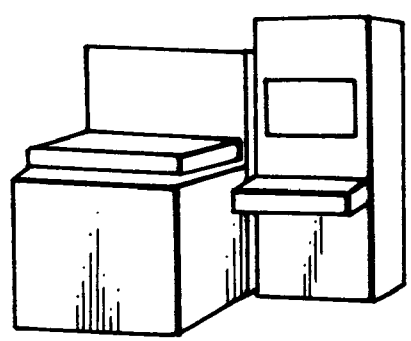
FIGS. 4(A), 4(B) and 4(C) are perspective views of inspecting apparatuses included in a circuit pattern inspecting and defect analyzing system.
Figure 4B:
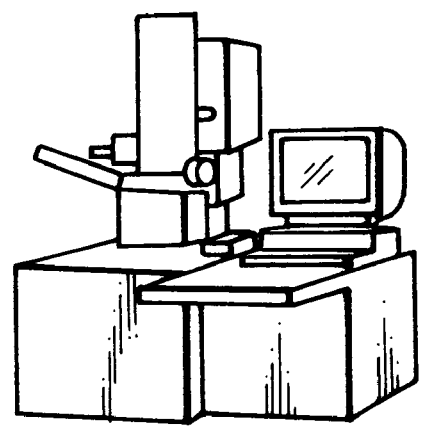
Figure 4C:
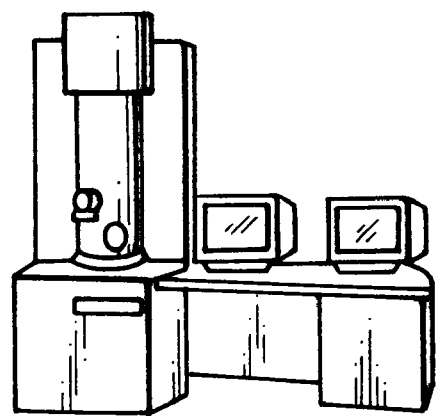
Figure 6:
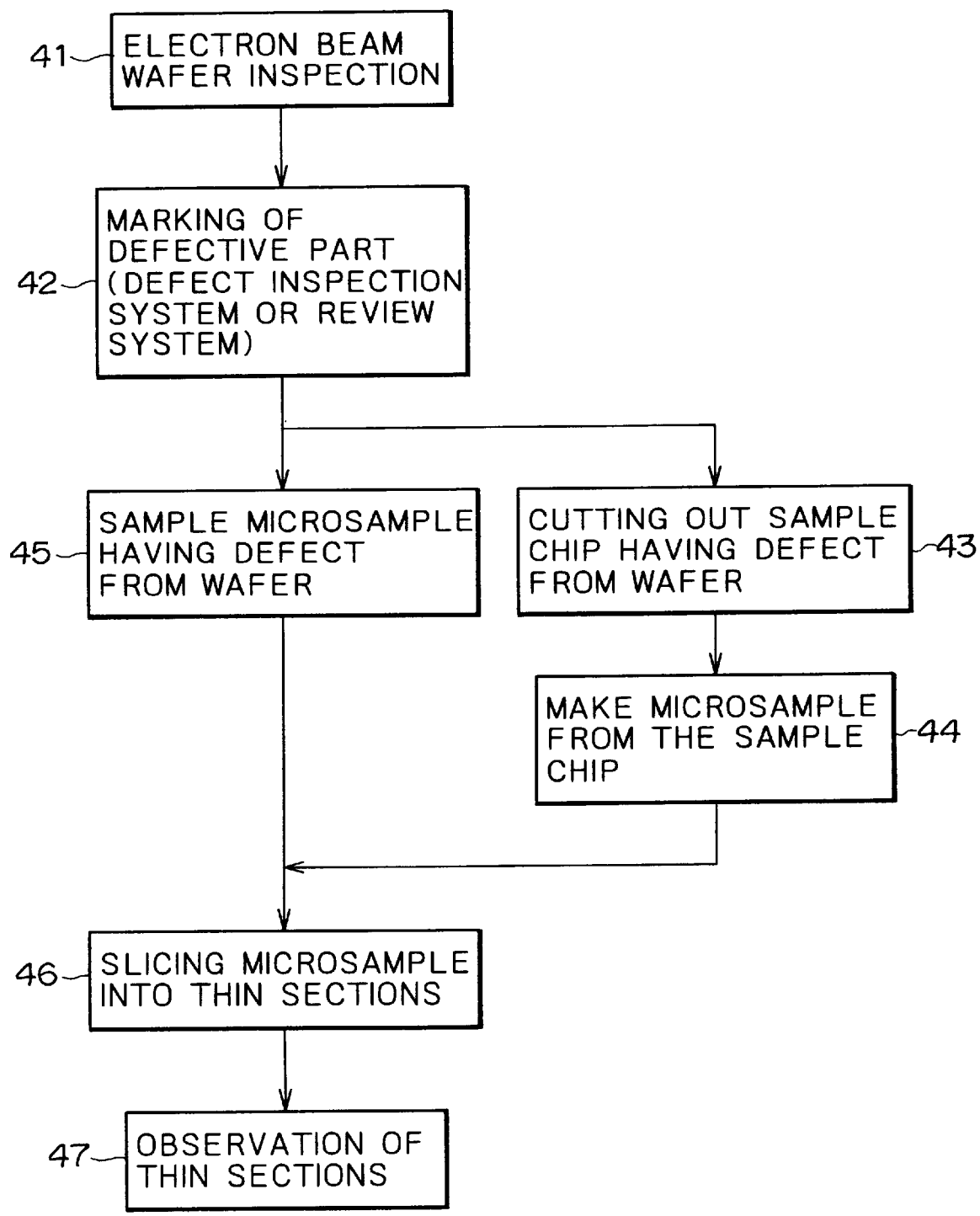
FIG. 6 is a flow chart more specifically showing the semiconductor device inspecting procedure shown in FIG. 1.
Figure 7A:
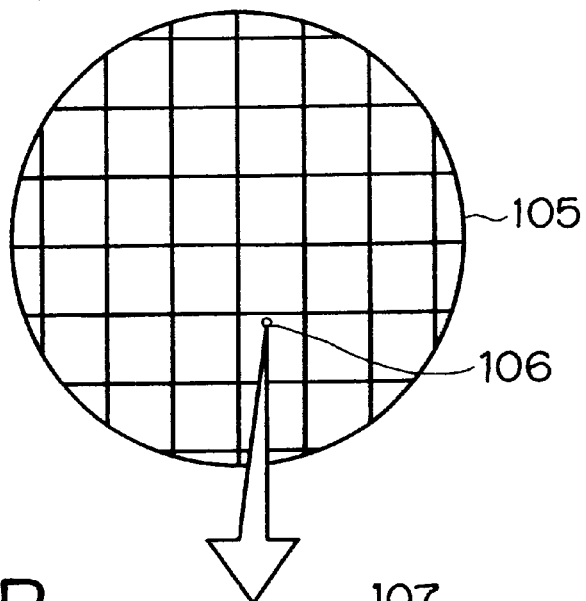
FIGS. 7(A), 7(B), 7(C) and 7(D) are perspective views of samples in the steps of the circuit pattern inspecting procedure shown in FIG. 1.
Figure 7B:
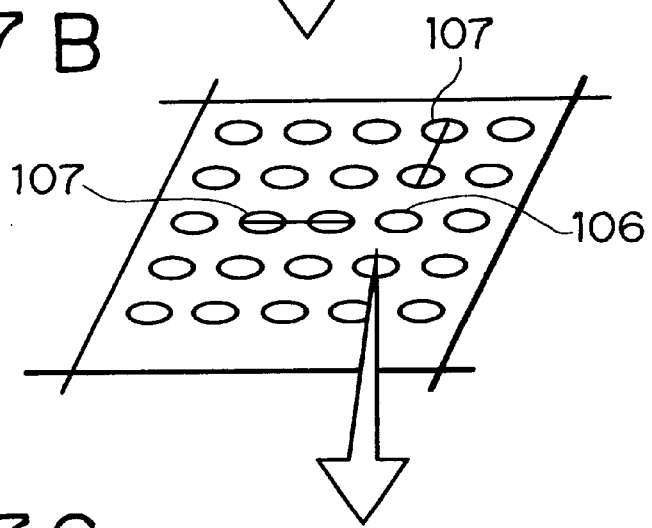
Figure 7C:
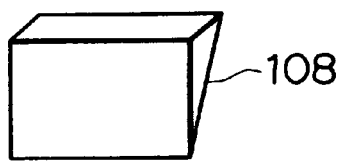
Figure 7D:
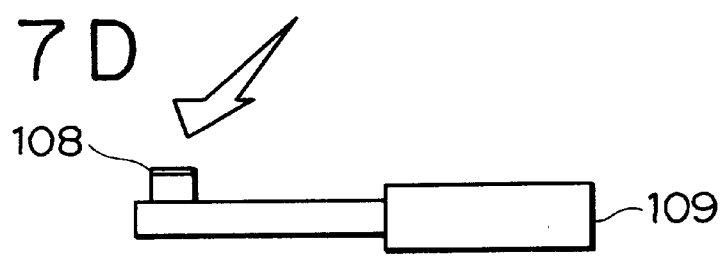
Figure 8:
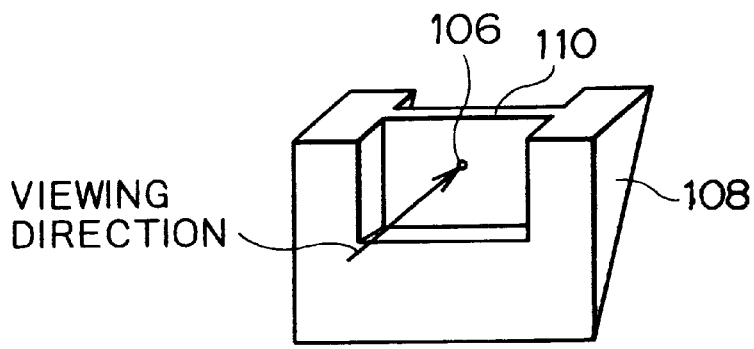
FIG. 8 is a perspective view of a sample mounted on a STEM.

FIG. 1 is a flow chart of a circuit pattern inspecting procedure to be carried out by the circuit pattern inspecting and defect analyzing system of the present invention, FIGS. 4(A), 4(B) and 4(C) are perspective views of inspecting apparatuses included in the circuit pattern inspecting and defect analyzing system, FIG. 5 is a schematic longitudinal sectional view of an electron beam wafer inspecting apparatus, FIG. 6 is a flow chart more specifically showing the semiconductor device inspecting procedure shown in FIG. 1, FIGS. 7(A), 7(B), 7(C) and 7(D) are perspective views of samples in the steps of the circuit pattern inspecting procedure shown in FIG. 1, and FIG. 8 is a perspective view of a sample mounted on a STEM. FIGS. 4(A), 4(B) and 4(C) are perspective views of an electron beam wafer inspecting apparatus, a focused ion beam apparatus and a STEM, respectively. In FIG. 1, "FIB", "TEM" and "STEM" stand for a focused ion beam apparatus, a transmission electron microscope and a scanning transmission electron microscope, respectively.

Referring to FIG. 1, a wafer is inspected for defects at an optional stage of a semiconductor device fabricating process by using the electron beam wafer inspecting apparatus shown in FIG. 4(A) in step 101. A microsample having a defect is taken from the wafer by using the focused ion beam apparatus shown in FIG. 4(B) in step 102. The microsample is held on a sample holder, and the sample holder holding the microsample is mounted on the focused ion beam apparatus, a portion including the defect of the microsample is sliced off the microsample by the focused ion beam apparatus to prepare a thin observation sample in step 103. The sample holder is commonly used for FIB, IEM, and STEM. The observation sample is observed under the TEM or the STEM shown in FIG. 4(C) in step 104. Thus, the operator determines the cause of the defect detected through the observation of the observation sample by using the electron beam wafer inspecting apparatus.

FIG. 5 is a schematic longitudinal sectional view of the electron beam wafer inspecting apparatus, which is disclosed in Japanese Patent Laid-open Nos. Hei 10-294345 and Hei 11-51886. The electron beam wafer inspecting apparatus has an electron-optic column 60, a load lock chamber 70, a sample chamber 71 and a control unit 77.

The electron-optic column 60 has an electron source 61 that emits an electron beam 62, a condenser lens 63 for condensing the electron beam 62, an objective 64 for focusing the electron bream 62 on a wafer 65, and a deflector 66 for deflecting the electron beam 62. Arranged in the sample chamber 71 are a stage 72 for supporting the wafer 65 thereon, an optical microscope 73 for optically observing the wafer 65 for the alignment of the wafer 65, and a secondary electron detector 68 for detecting secondary electrons 67 produced when the wafer 65 is irradiated with the electron beam 62. A detection signal provided by the secondary electron detector 68 is converted into an image signal by an image forming unit 74 and the image signal is transferred through a bus 78 to a defect identifying unit 75. The defect identifying unit 75 extracts a defect from an image represented by the image signal. An image of the defect is displayed on the screen of a monitor unit 69 and is transferred through a LAN to a database.

The image signal produced by the image forming unit 74 is stored in a storage device 76, the image signal is compared with another image signal produced from another signal. The difference between those successive image signals is considered to be a defect and an image of the defect is displayed on the screen of the monitor unit 69.

Since the position of the wafer 65 irradiated with the electron beam 62 is determined on the basis of stage position data about the position of the stage 72 obtained by the optical microscope 73, defect position data about the position of the defect is determined from the stage position data on the position of the stage 72 and the image displayed on the screen of the monitor unit 69.

These operations including an operation for moving the stage 72 and an operation for deflecting the electron beam 62 are controlled by control signals produced by a microcomputer included in the control unit 77. The operator enters data on the name and history of the wafer 65, conditions for inspection and commands for operations before starting inspection.

The electron beam wafer inspecting apparatus is capable of changing the current of the electron beam and deceleration voltage for decelerating the velocity of electrons at arrival on the wafer 65. The current of the electron beam and the deceleration voltage are adjusted to detect defects in the internal structure of the semiconductor device that cannot be detected through the observation of the surface of the wafer 65 by using an optical surface inspecting apparatus. Defects, such as a disconnected portion and a shorted portion shown in FIG. 2, can be detected by using a potential contrast effect.

Referring to FIG. 6, after the inspection by using the electron beam wafer inspecting apparatus has been completed in step 41, defect position data on the position of the defect in the wafer is marked in step 42; that is, as shown in FIG. 7(A), a portion of a wafer 105 near a detected defect 106 is marked to facilitate recognizing the defect 106 on the focused ion beam apparatus, the coordinates of the position of the defect 106 or the portion near the defect 106 are determined on a common coordinate system that is used by apparatuses for the following processes or coordinate transformation by apparatuses for the following process is facilitated.

Figure 2:
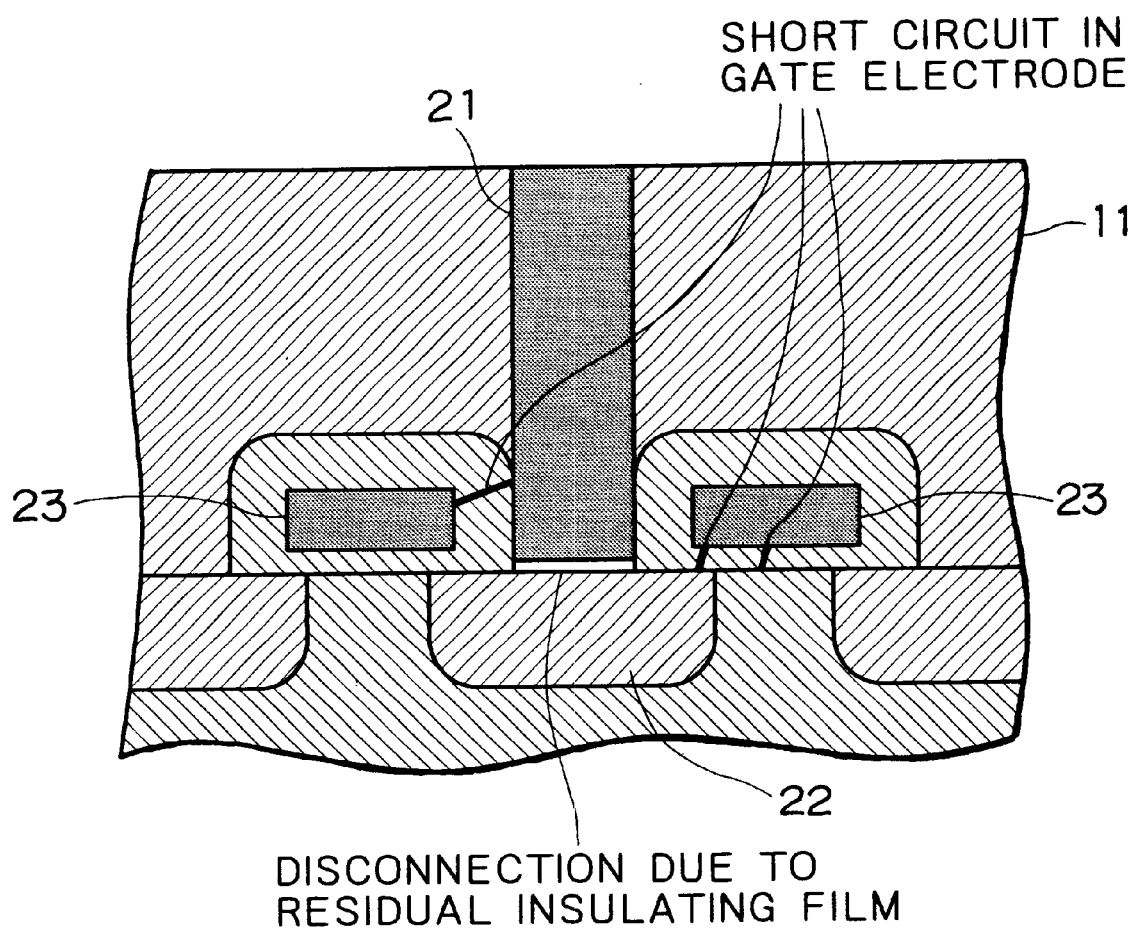
FIG. 2 is a fragmentary sectional view of a portion near a surface portion of a semiconductor device.
Figure 3:
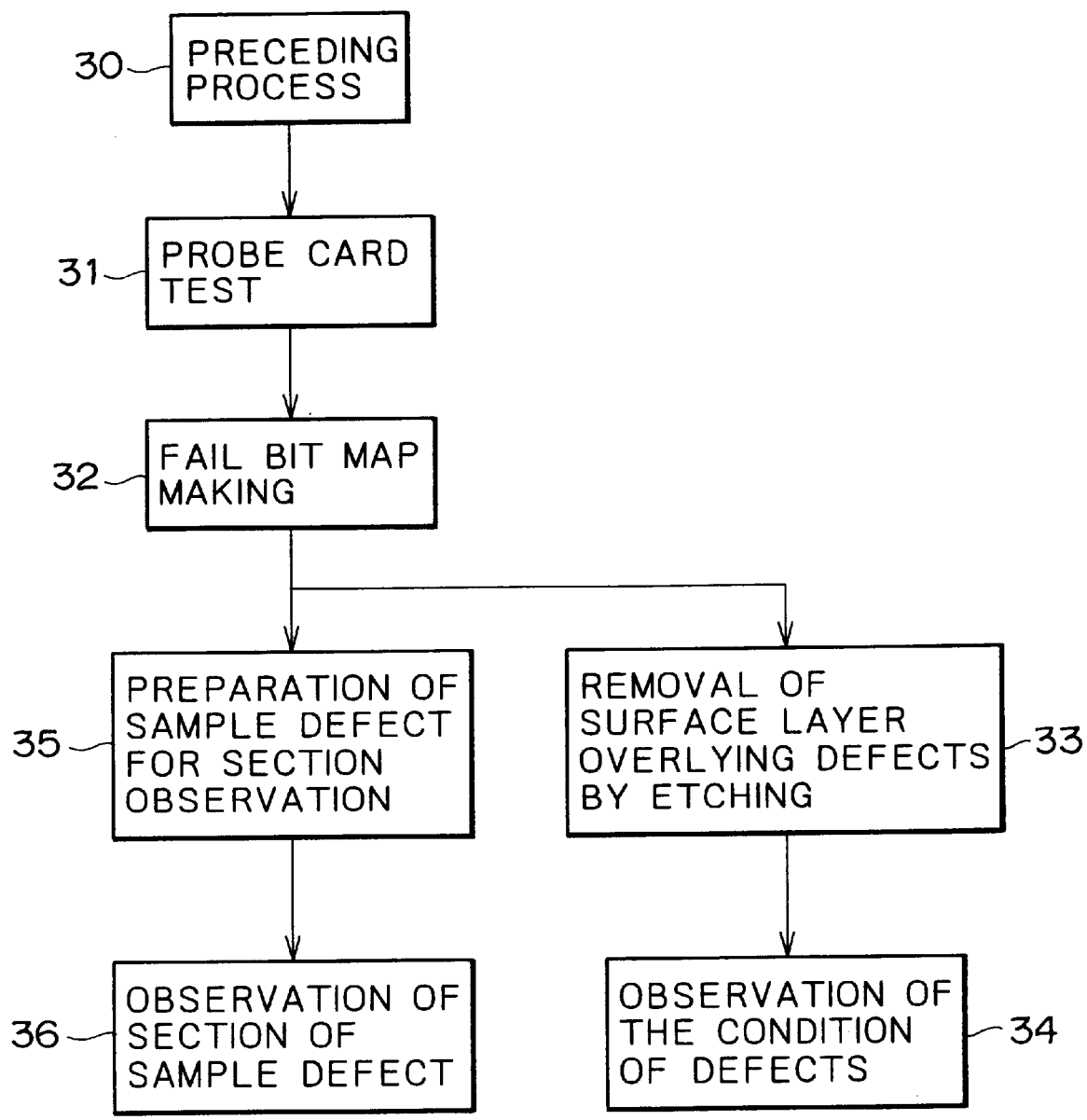
FIG. 3 is a flowchart of a conventional semiconductor device inspecting procedure.

FIG. 7(B) shows a pattern of round plugs 21 shown in FIG. 2. A defective plug 21 not properly connected to the lower wiring layer 22 (FIG. 2) is detected in a dark defect 106 by the potential contrast effect. After defect extraction has been completed, portions near the defect 106 are marked with marks 107 with the electron beam of the electron beam wafer inspecting apparatus. The detected defect 106 may be marked with the mark 107 by a review apparatus capable of recognizing the detected defect 106 by potential contrast effect.

In step 45 (FIG. 6), a microsample 108 including the defect 106 shown in FIG. 7(C) is cut out from the wafer 105 by the focused ion beam apparatus shown in FIG. 4(B) capable of sampling. The microsample 108 is fixedly mounted on a sample holder 109 as shown in FIG. 7(D). Sampling techniques for taking the microsample 108 by using the focused ion beam apparatus are disclosed in Japanese Patent Laid-open No. Hei 5-52721.

A portion of the microsample 108 is thinned by the focused ion beam apparatus to form a thin portion 110 as shown in FIG. 8. The thinned microsample 108 is mounted on a common sample holder 109 which is used by both a TEM or the STEM shown in FIG. 4(C), and the focused ion beam apparatus, which improves greatly the efficiency of operations for thinning the microsample 108 and observation of the thin portion 110 of the microsample 108. This technique is disclosed in Japanese Patent Laid-open No. Hei 6-103947.

The microsample 108 may be taken by cutting the microsample 108 directly from the wafer 105 as mentioned above or by cutting out a chip including the defect 106 from the wafer 105 and cutting out the microsample 108 from the chip by using the focused ion beam apparatus. The microsample 108 can be obtained efficiently by using the mark indicating the defect 106 or the position data, i.e., the coordinates, on the position of the defect 106. The thinning of the microsample 108 and the observation of the section of the microsample 108 are executed in steps 46 and 47, respectively.

Figure 9:
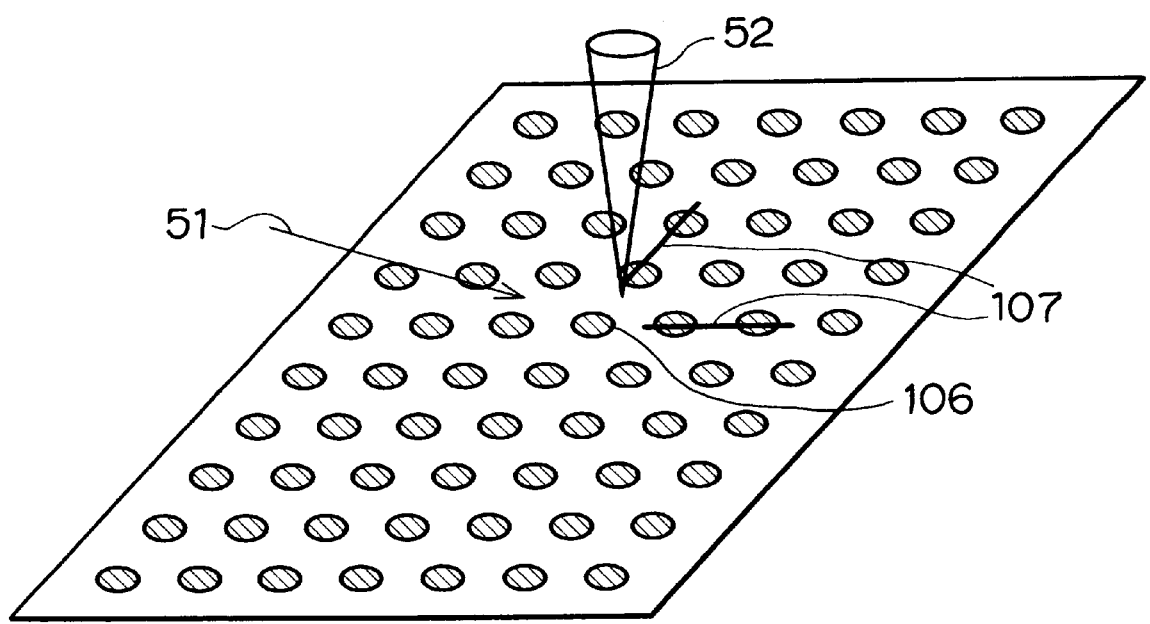
FIG. 9 is a perspective view of a circuit pattern for a semiconductor device.

A method of marking a detected defect will be described with reference to FIG. 9 showing the pattern of plugs shown in FIG. 7(B), i.e., a circuit pattern of a semiconductor device. The marks 107, line segments, are formed in portions of the wafer near the detected defect 106 detected by the electron beam wafer inspecting apparatus shown in FIG. 4(A) by moving a spot of an electron beam 52 in directions parallel to the X-axis and the Y-axis. Since a gas containing carbon or the like prevails over the wafer, a substance is deposited on the wafer in the shapes of the marks 107 when the portions of the wafer corresponding to the marks 107 is irradiated through the gas with the electron beam 52.

A source gas 51 for deposition may be supplied into a space around the defect 106 and portions of the wafer corresponding to the marks 107 may be irradiated with the electron beam 52 to form the marks 107 on the wafer by decomposing the source gas 51. The use of the source gas is effective in forming the marks 107 with reliability.

The position of a defect can be indicated by coordinate data instead of by marks and the defect can be located on the basis of the coordinate data, which, however, has the following problem. Generally, images displayed on the electron beam wafer inspecting apparatus and the focused ion beam apparatus are distorted and the scales of those apparatuses have errors. The accurate correction of these errors intrinsic to the apparatuses is very difficult. When locating a defective circuit element in circuit elements of the same shape arranged on a wafer in a regularly repetitive circuit pattern at pitches of 0.1 µm or below on the basis of coordinate data that indicates distance from a reference point to the defective circuit element by the electron beam wafer inspecting apparatus and the focused ion beam apparatus on which images including errors are displayed, it is possible that a good circuit element adjacent to the defective circuit element is mistaken for the defective circuit element.

When the defect is observed on the focused ion beam apparatus shown in FIG. 4(B), a signal produced by the defective circuit element is often different from those produced by the good circuit elements owing to potential contrast effect. Therefore, wafer or the chip is positioned on the focused ion beam apparatus by using the coordinate data on the defective circuit element detected by the electron beam wafer inspecting apparatus to place the portion of the wafer or the chip including the defective circuit element in the field of observation of the focused ion beam apparatus, and the defective circuit element is identified precisely by the agency of potential contrast effect. When the focused ion beam apparatus is thus used, the position of the defective circuit element can be easily determined.

A defective circuit element in a sample in which satisfactory potential contrast effect cannot be expected can be located by counting the number of circuit elements between a reference point and the defective circuit element. In most semiconductor devices, circuit elements are arranged in a periodic, repetitive pattern. A pattern of via holes to be filled up with plugs interconnecting a circuit in an upper layer and a circuit in a lower layer is a representative periodic, repetitive pattern. The electron beam wafer inspecting apparatus determines the position of the defective circuit element by calculating the number of repetition of the unit patterns of the repetitive pattern in a range between the reference point and the position of the defective circuit element by using the coordinate data representing the position of the defective circuit element. The focused ion beam apparatus determines the position of the defective circuit element by counting the number of the repeated unit patterns of the repetitive pattern in a range between the reference point and the position of the defective circuit element. The unit patterns may be individually counted or groups each of some unit patterns may be counted. The unit pattern or the groups of unit patterns may be counted by the operator. The apparatus may be provided with a defect specifying unit for specifying a defect included in a plurality of unit patterns displayed on the screen.

The focused ion beam apparatus is provided with a defect specifying unit that converts the coordinate data into the number of repeated unit patterns in a range between the reference point and the defective circuit element, calculates a correction for correcting a distorted image on the basis of the number of repeated pitches of the pattern per size of one pixel in the image displayed on the focused ion beam apparatus, determines the position of the defective circuit element on the basis of the distance between the reference point and the defective circuit element represented by the number of pixels, and specifies the defective circuit element included in a plurality of unit patterns displayed on the screen.

Since the defect which cannot be detected through the observation of the surface of a semiconductor device is detected by the electron beam wafer inspecting apparatus and the position of the defective circuit element having the detected defect is determined precisely, the accuracy and efficiency of the subsequent analysis of the causes of defect can be improved. Since the microsample including the defect detected by the electron beam wafer inspecting apparatus is taken by using the focused ion beam apparatus and the microsample is mounted on the common sample holder which is used by both the section observing apparatus, such as a TEM or a STEM, and the focused ion beam apparatus, the causes of the defects can be efficiently analyzed.

The present invention detects the defect in the circuit pattern of a semiconductor device formed on the wafer in the preceding wafer processing process and facilitates the extraction and observation of the portion of the wafer including the defect. Therefore, the accuracy of analysis of the causes of the defects is improved, and the determination of the causes of the defects and the execution of measures to eliminate the causes of the defects can be achieved in a greatly reduced time after the formation of the defects.

What is claimed is:

1. A method of inspecting a circuit pattern for defects and analyzing the defects, said method comprising the steps of:
    irradiating first and second regions in a circuit pattern formed on a semiconductor wafer with an electron beam, during circuit pattern forming processes;
    forming images of the irradiated first and second regions through the detection of secondary electrons emitted as a result of irradiation with the electron beam;
    detecting a difference between the formed images of the irradiated first and second regions as a defect in the circuit pattern formed on a semiconductor wafer;
    determining a position of the defect;
    locating a microsample including the defect on the basis of the determined position of the defect and cutting out the microsample from the semiconductor wafer;
    thinning a portion of the microsample cut out to form a thin portion for observation; and
    observing the thin portion of the microsample with an electron microscope to determine causes of the defect.

2. A system for inspecting a circuit pattern for defects and analyzing defects, said system comprising:
    an electron beam wafer inspecting apparatus that irradiates first and second regions in a circuit pattern formed on a semiconductor wafer with an electron beam during circuit pattern forming processes, detects secondary electrons emitted as a result of irradiation of the circuit pattern with the electron beam, forms images of the irradiated first and second regions, and identifies a defect from a difference between the formed images of the irradiated first and second regions through comparative observation of the respective images of the first and second regions;
    a focused ion beam apparatus that locates a microsample including the defect, cuts out the microsample from the semiconductor wafer, mounts the microsample on a sample holder and processes the microsample to form a thin portion for observation; and
    a transmission electron microscope that irradiates the thin portion of the microsample mounted on the sample holder with an electron beam for observation of the defect.

3. A circuit pattern inspecting system for locating a defect in a circuit pattern formed on a semiconductor wafer, cutting out a microsample including the defect from the semiconductor wafer, observing the defect and determining causes of the defect, said circuit pattern inspecting system comprising:
    a defect detecting unit that irradiates the semiconductor wafer with an electron beam during circuit pattern forming processes, detects secondary electrons emitted as a result of irradiation of the circuit pattern with the electron beam, forms images of irradiated first and second regions, extracts a difference between the formed images of the irradiated first and second regions, and identifies the extracted difference as a defect through the comparative observation of the respective images of the first region and the second region; and
    a position data creating apparatus that creates position data on the position of the defect.

4. The circuit pattern inspecting system according to claim 3, wherein the position data created by the position data creating apparatus is obtained by irradiating the semiconductor wafer with the electron beam.

5. The circuit pattern inspecting system according to claim 3, wherein the position data creating apparatus creates the position data on the basis of coordinates of the defect and the number of unit patterns of the circuit pattern formed on the semiconductor wafer.

6. A circuit pattern inspecting and defect analyzing system comprising:
    an electron beam wafer inspecting apparatus that irradiates first and second regions in a circuit pattern formed on a semiconductor wafer with an electron beam during circuit pattern forming processes, detects secondary electrons emitted as a result of irradiation of the circuit pattern with the electron beam, forms images of the irradiated first and second regions, extracts a difference between the formed images of the irradiated first and second regions, and finds the extracted difference as a defect through the comparative observation of the respective images of the first and second regions;
    a focused ion beam apparatus that takes a sample including the defect found by the electron beam wafer inspecting apparatus from the semiconductor wafer, mounts the sample on a sample holder, and thins a portion of the sample to form a thin portion; and
    a transmission electron microscope that irradiates the sample held on the sample holder with an electron beam for observation.

7. A circuit pattern inspecting system comprising:
    an electron-optic column that irradiates first and second regions in a circuit pattern formed on a semiconductor wafer with an electron beam;
    a defect detecting unit that detects secondary electrons emitted as a result of irradiation of the first and second regions of the circuit pattern during circuit pattern forming processes with the electron beam, forms images of the irradiated first and second regions and compares the respective images of the first and second regions to extract a difference between the images and find the difference as a defect in the circuit pattern; and
    a marking apparatus that puts marks indicating a position of the detected defect on the semiconductor wafer.

8. The circuit pattern inspecting system according to claim 7, wherein the marking apparatus puts the marks on the semiconductor wafer by projecting an electron beam on the semiconductor wafer.

9. A circuit pattern inspecting system comprising:
    a monitor unit that positions a semiconductor wafer provided with a circuit pattern on the basis of coordinates indicating a position of a defect in the circuit pattern detected by irradiating first and second regions of the circuit pattern with an electron beam during circuit pattern forming processes, detecting secondary electrons emitted as a result of irradiation of the circuit pattern with the electron beam, forming images of the irradiated first and second regions and comparing the respective images of the first and second regions to extract a difference between the images and find the difference as a defect in the circuit pattern, and displays the defect on a screen; and a defect specifying unit that specifies a unit pattern including the defect in a plurality of unit patterns displayed on the screen by using position data regarding the defect.

10. A method of inspecting a circuit pattern for defects and analyzing defects, said method comprising the steps of:

irradiating first and second regions in a circuit pattern formed on a semiconductor wafer with an electron beam during circuit pattern forming processes;

forming images of the irradiated first and second regions through the detection of secondary electrons emitted as result of irradiation with the electron beam;

detecting a defect in the circuit pattern through the comparison of the images of the first region and the second region;

taking a sample including the detected defect from the semiconductor wafer;

mounting the sample on a sample holder and thinning a portion of the sample to form a thin portion; and irradiating the thin portion of the sample mounted on the sample holder with an electron beam to observe the defect.

11. A method of inspecting a circuit pattern for defects and analyzing defects, said method comprising the steps of:

irradiating first and second regions in a circuit pattern formed on a semiconductor wafer with an electron beam during circuit pattern forming processes;

forming images of the irradiated first and second regions through the detection of secondary electrons emitted as a result of irradiation with the electron beam;

detecting a defect in the circuit pattern through the comparison of the images of the first region and the second region; and putting marks indicating the detected defect on the semiconductor wafer.

12. The method of inspecting a circuit pattern for defects and analyzing defects according to claim 11, wherein the step of putting the marks on the semiconductor wafer forms the marks by irradiating the semiconductor wafer with an electron beam.

13. A method of inspecting a circuit pattern for defects and analyzing defects, said method comprising the steps of:

irradiating first and second regions in a circuit pattern formed on a semiconductor wafer with an electron beam during circuit pattern forming processes;

detecting a defect by detecting secondary electrons emitted as a result of irradiation of the circuit pattern with the electron beam, forming images of the irradiated first and second regions, extracting a difference between the formed images of the irradiated first and second regions, and finding the extracted difference as a defect in the circuit;

positioning the semiconductor wafer on the basis of coordinates indicating a position of the defect;

displaying an image of the defect on a screen included in a monitor unit; and specifying a unit pattern having the defects included in a plurality of unit patterns displayed on the screen of the monitor unit on the basis of position data on the defect.

* * * * *